(12) United States Patent
Lee et al.

(10) Patent No.: US 6,774,014 B1
(45) Date of Patent: Aug. 10, 2004

(54) METHOD OF FABRICATING SPHERICAL QUANTUM DOTS DEVICE BY COMBINATION OF GAS CONDENSATION AND EPITAXIAL TECHNIQUE

(75) Inventors: Si-Chen Lee, Taipei (TW); Tse-Chi Lin, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 10/400,645

(22) Filed: Mar. 28, 2003

(51) Int. Cl.[7] .......................... H01L 21/20; H01L 21/36
(52) U.S. Cl. ....................................... 438/478; 438/962
(58) Field of Search ........................ 117/3; 257/12–16; 438/46, 54, 63, 66, 67, 800, 962

(56) References Cited

U.S. PATENT DOCUMENTS 6,375,737 B2 * 4/2002 Shih et al. ..................... 117/3
6,596,555 B2 * 7/2003 Bensahel et al. ............. 438/22

* cited by examiner

*Primary Examiner*—Evan Pert
*Assistant Examiner*—Asok K. Sarkar
(74) *Attorney, Agent, or Firm*—Rabin & Berdo, P.C.

(57) ABSTRACT

A method of fabricating a device with spherical quantum dots by a combination of gas condensation and an epitaxial technique includes the following steps: (a) a quantum dots growth step, when the quantum dots are grown on the substrate by a gas condensation method; (b) a quantum dots processing step, when an ultrasonic cleaner is used with an organic solvent to vibrate the substrate in which quantum dots have been grown in step (a), or the substrate in which quantum dots have been grown in step (a) is thermally annealed at a high temperature to obtain a thin layer of quantum dots; and (c) an epitaxial layer cover step, when an epitaxial layer is covered over the quantum dots processed by step (b) by an epitaxial technique. By virtue of the above processes, a device with completely spherical quantum dots is obtained.

20 Claims, 8 Drawing Sheets

METHOD OF FABRICATING SPHERICAL QUANTUM DOTS DEVICE BY COMBINATION OF GAS CONDENSATION AND EPITAXIAL TECHNIQUE

BACKGROUND OF THE INVENTION

1. Field of the Invention

The present invention relates to a method of fabricating a spherical quantum dot device by a combination of gas condensation and an epitaxial technique.

2. Description of the Prior Art

Quantum dot (QD) structures have already been used extensively in Laser Diodes (LD), Light-Emitting Diodes (LED), and infrared detectors (QDIP), and are now replacing traditional quantum well structure gradually. Although the quantum well infrared detector has shown good performance nowadays, the property of a forbidden normal incidence must be overcome in order to fabricate the detector arrays. A quantum dot infrared detector has been developed because it has several advantages such as high normal incidence absorption, high operation temperature, and so on. Molecular Beam Epitaxy (MBE) and Metal Organic Chemical Vapor Deposition (MOCVD) are employed for growing quantum dots and the stress resulted from the lattice mismatch between a substrate and an epilayer so as to form quantum dots. Besides, there are other methods that can also form quantum dots, such as chemical synthesis and gas condensation. Gas condensation can be achieved by a thermal evaporation method, a sputtering method, an e-beam evaporation method, a laser ablation method and so on. However, in the epitaxial techniques such as MBE and MOCVD, the grown quantum dots cannot be formed with a complete spherical-like structure and the ability of an infrared detector to absorb normal incidence radiation is deficient.

SUMMARY OF THE INVENTION

A primary objective of the present invention is to provide a method of fabricating a device with spherical quantum dots device by a combination of gas condensation and an epitaxial technique. The present invention can improve the structure of spherical quantum dots so as to achieve a three-dimensional quantum confinement effect, and can improve the ability to absorb normal incidence absorption radiation so as to reduce the cost of fabricating detector arrays.

Another objective of the present invention is to provide a method of fabricating a multi-layer quantum dots device. By repeating the method of fabricating the spherical quantum dots device, the multi-layer quantum dots device with excellent quality can be achieved by a combination of gas condensation and an epitaxial technique.

To achieve the above and other objectives, a method of fabricating a spherical quantum dot device by a combination of gas condensation and an epitaxial technique comprises the following steps:

a. A quantum dots growth step, when quantum dots are grown on a substrate by gas condensation method.

b. A quantum dots process processing step, when an ultrasonic cleaner is used with an organic solvent to vibrate the substrate in which quantum dots have been grown in step (a) or the substrate is thermally annealed to high temperature in which quantum dots have been grown thereon in step (a);

c. An epitaxial layer cover step, when the epitaxial technique is used for covering an epitaxial layer on the quantum dots sample which has been processed by step (b).

By virtue of the above-mentioned steps, a device with completely spherical quantum dots can be fabricated and the faults of the foregoing epitaxial growth technique, which cannot form complete spherical quantum dots, can be overcome.

Moreover, the present invention further comprises a substrate process step, wherein a reactive ion etching method is used to process the substrate and make the surface of the substrate rough so as to increase the growth density of quantum dots in the quantum dots growth step.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
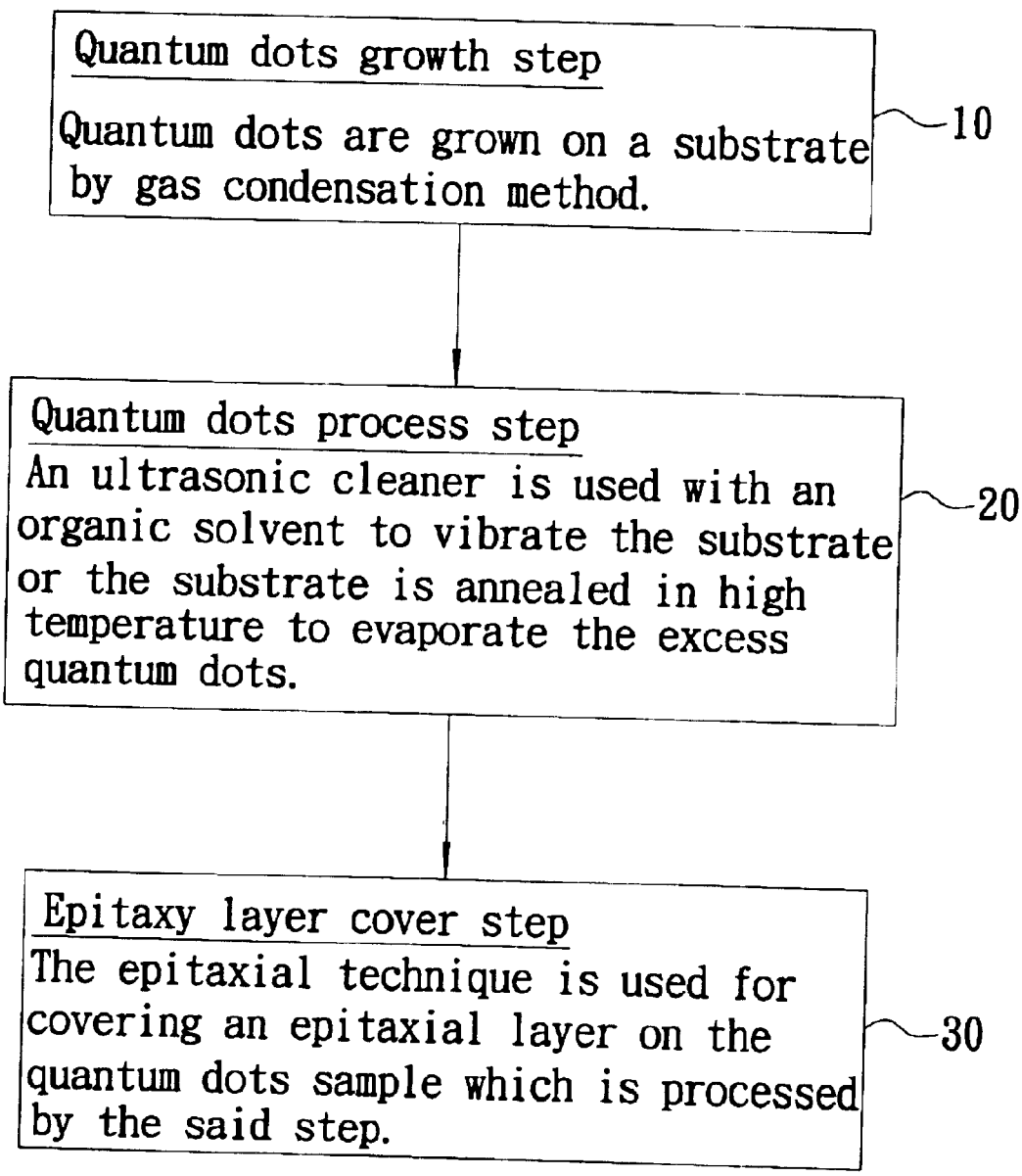
FIG. 1 is a process flow diagram of the present invention.

Please refer to FIG. 1, which shows a process flow diagram of the present invention, which mainly includes three steps as follows:

a. A quantum dots growth step 10: quantum dots are grown on a substrate by a gas condensation method;

b. A quantum dots process step 20: an ultrasonic cleaner is used with an organic solvent to vibrate the substrate in which quantum dotes have been grown in step (a), or the substrate in which quantum dots have been grown in step (a) is annealed at a high temperature;

c. An epitaxial layer cover step 30: the epitaxial technique is used for covering an epitaxial layer on the quantum dots sample which has been processed by step 20.

In step 10, for example, the processing of gas condensation quantum dots may be processed as follows:

(1) Thermal Evaporation Method

By utilizing argon and heating, evaporation elements are saturated and then condensed to form quantum dots.

(2) Sputtering Method

By utilizing argon and sputtering, evaporation elements are saturated and then condensed to form quantum dots.

(3) Electron Beam Evaporation Method

By utilizing argon and electron beam heating, evaporation elements are saturated and then condensed to form quantum dots.

(4) Laser Ablation Method

By utilizing laser ablation, the surface of the target is saturated and then condensed to form quantum dots.

Figure 2:
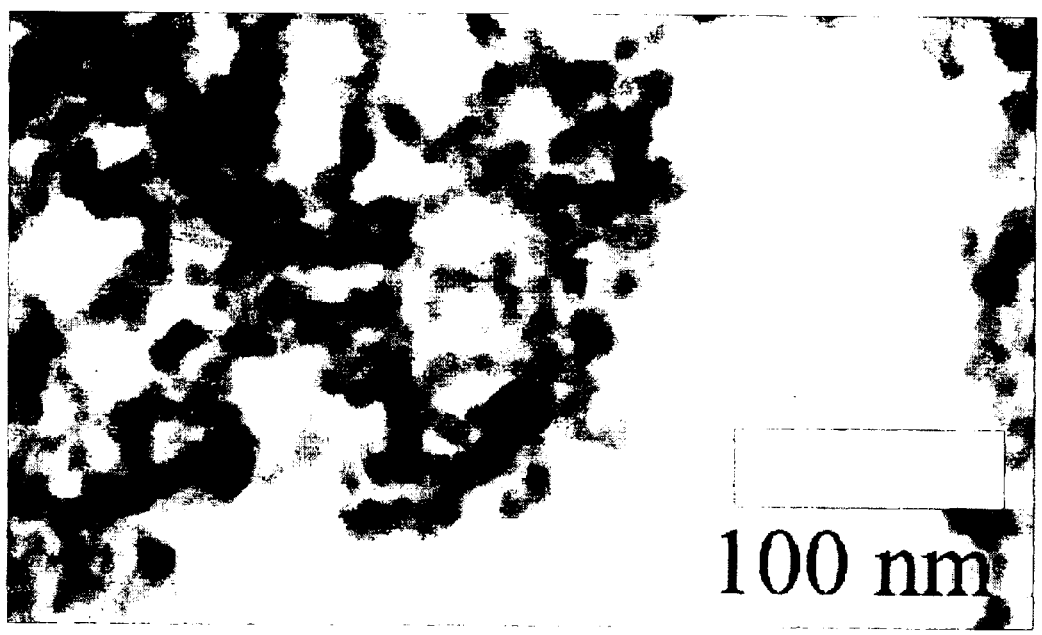
FIG. 2 is a schematic view illustrating the growth of silicon-germanium (SiGe) alloy quantum dots on the substrate by the thermal evaporation method.

The material of quantum dots, which grows on the substrate by gas condensation method, can be any kind of material, such as metal material, semiconductor material, oxide insulator material or the combination of the above-mentioned materials. Please refer to FIG. 2, wherein silicon and germanium are used, and argon is filled up on the substrate by a thermal evaporation method so as to grow silicon-germanium (SiGe) alloy quantum dots.

In step 20, the organic solvents, which are added in an ultrasonic cleaner, can be either alcohol or acetone. Methanol is used in the present embodiment. Besides, the present invention provides two methods in order to increase the density of quantum dots as follows.

Method 1

Before the quantum dots growth step (step 10), the substrate is processed by reactive ion etching (RIE) and the surface of the substrate is processed to be rough so as to increase the growth density of quantum dots.

Method 2

In the quantum dots process step (step 20), when the substrate is vibrated in the organic solvent, a suitable amount of alumina powder is added simultaneously so as to break the agglomeration of quantum dots into a single layer.

Figure 3:
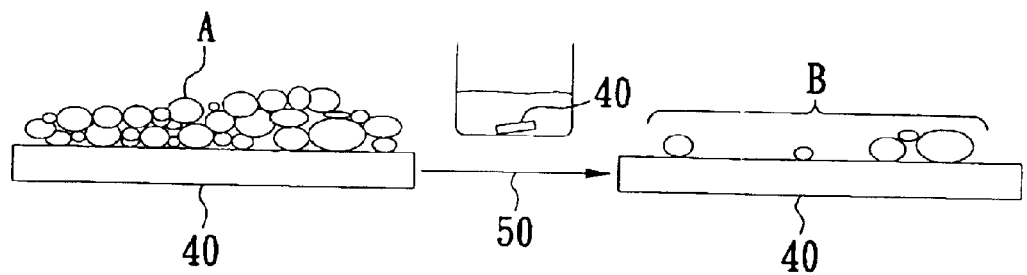
FIG. 3 is a flow diagram illustrating the process for preparing the monolayer quantum dots material by methanol on a substrate with a smooth surface.
Figure 4:
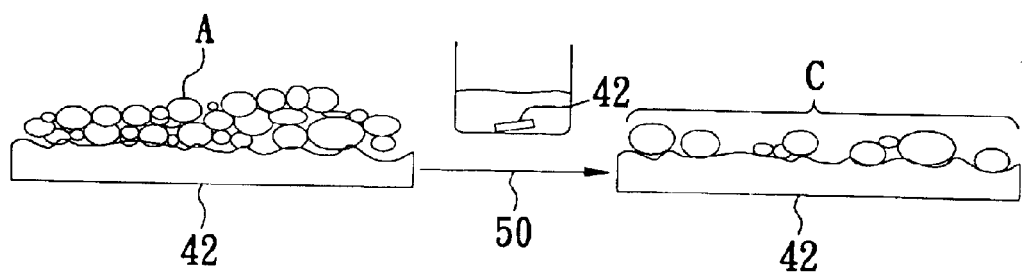
FIG. 4 is a flow diagram illustrating the process for preparing the monolayer quantum dots material by methanol on a substrate with a rough surface (by utilizing the reactive ion etching method so as to make the surface of the substrate rough)
Figure 5:
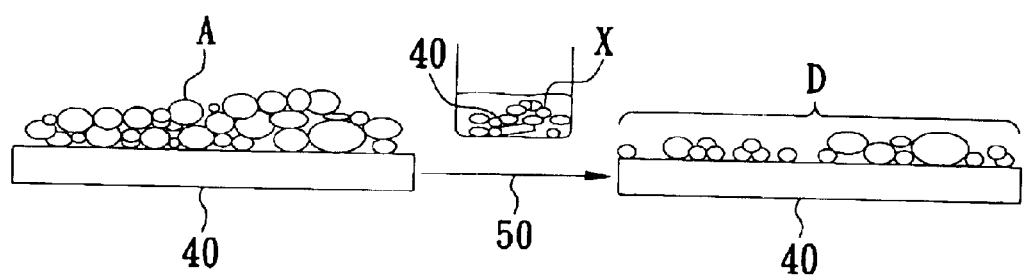
FIG. 5 is a flow diagram illustrating the process for preparing the monolayer quantum dots material by methanol on a substrate with a smooth surface (during the step of vibrating the organic solvent, a suitable amount of aluminum oxide powder is added simultaneously)
Figure 6A:
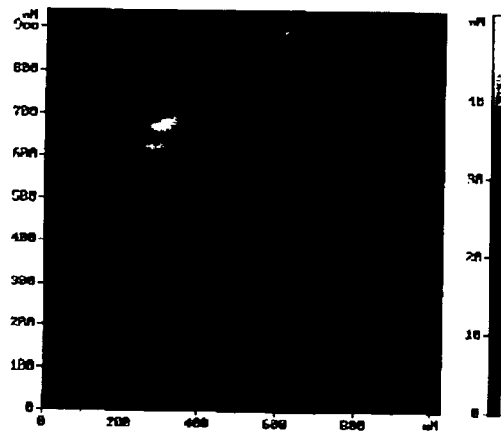
FIGS. 6A–6F are schematic views illustrating the experimental results via atomic force microscopy (FIGS. 6A–6C) and scanning electron microscopy (FIGS. 6D–6F) respectively corresponding FIG. 3 to FIG. 5 (FIGS. 6A and 6D correspond to FIG. 3, FIGS. 6B and 6E correspond to FIG. 4, and FIGS. 6C and 6F correspond to FIG. 5)
Figure 6D:
Figure 6B:
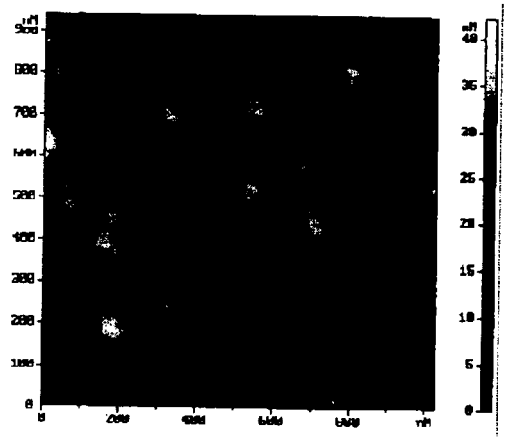
Figure 6E:
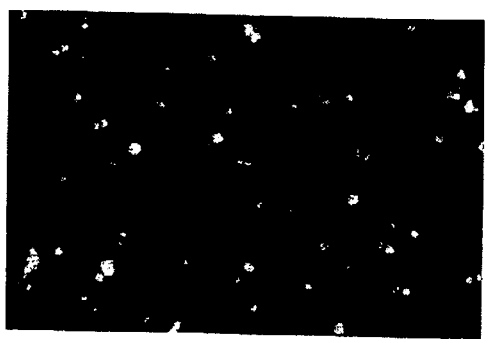
Figure 6C:
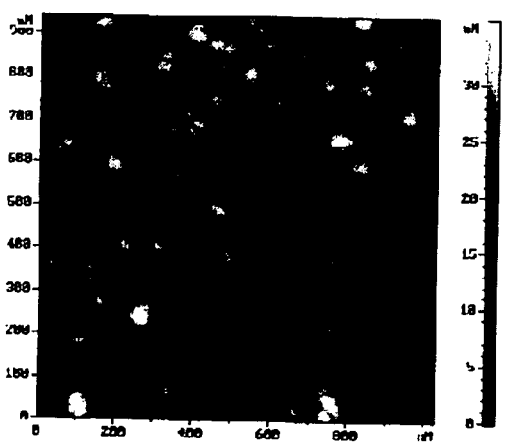
Figure 6F:
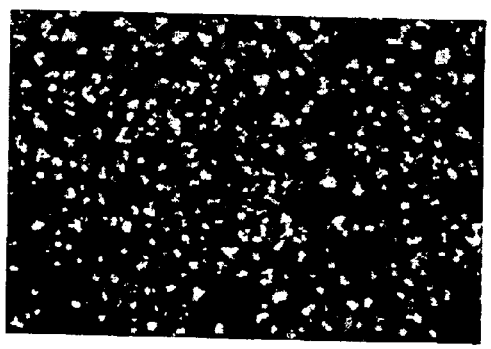

Please refer to FIG. 3 to FIG. 5, which shows the result of different experimental procedures. In FIG. 3, two kinds of elements, such as silicon and germanium, are provided to grow silicon-germanium (SiGe) alloy quantum dots A on a smooth substrate 40. Subsequently, the substrate 40 is put into methanol and then vibrated for ten minutes (indicated by reference number 50) so as to form a monolayer and a few SiGe alloy quantum dots on the substrate 40. As shown in FIG. 4, reactive ion etching is applied for about four minutes and a rough surface 42 of the substrate 40 is then obtained before the deposition of quantum dots. As shown in FIG. 5, during the vibration processing with methanol, alumina powder X in the amount of three grams is added therein and is vibrated at the same time. Then, the result of processing to form a monolayer of quantum dots using menthol is shown in FIGS. 6A through 6F by utilizing an atomic force microscopy and a scanning electron microscopy, respectively, so as to detect the signals thereof. FIGS. 6A to 6C show the detected results utilizing atomic force microscopy, and FIGS. 6D to 6F show the detected results utilizing scanning electron microscopy. FIGS. 6A and 6D show the experimental result in the portion B of FIG. 3, FIGS. 6B and 6E show the experimental result in the portion C of FIG. 4, and FIGS. 6C and 6F show the experimental result of the portion D of FIG. 5. Thereby, the surface of the substrate can be roughened (as for FIG. 4, the result is shown in FIGS. 6B and 6E) and a suitable amount of alumina powder can be added (as for FIG. 5, the result is shown in FIGS. 6B and 6E) so as to enhance the growth density of quantum dots. That is, the density C and D of SiGe alloy quantum dots is higher than the density B thereof.

Besides, in step 20, a suitable amount of any kind of metal powder or metal oxide powder, which is smaller than 1 micrometer, is able to be added into the organic solvent during the vibration process so as to obtain a thin layer of quantum dots. Besides, the substrate can be loaded into an annealing furnace to evaporate excess quantum dots at a high temperature to obtain a thin layer of quantum dots.

Figure 7:
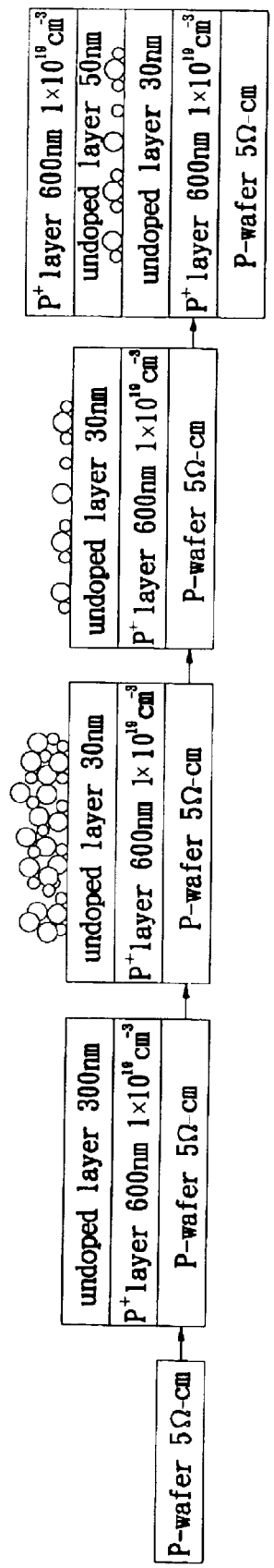
FIG. 7 is a schematic view illustrating the example process of fabricating an infrared detector by a combination of gas condensation and an epitaxial technique.

In step 30, the epitaxial technique for the epitaxial layer cover process 30 can be either a molecular beam epitaxy (MBE) or a metal organic chemical vapor deposition (MOCVD). Please refer to FIG. 7, which is a schematic view illustrating an example of the process of fabricating an infrared detector by a combination of gas condensation and an epitaxial technique, wherein quantum dots are first grown on the substrate, then the sample is processed in an ultrasonic cleaner with methanol, and finally the quantum dots are covered by epitaxial layers grown by molecular beam epitaxy.

Figure 8:
FIG. 8 is a schematic view illustrating the side image of an SiGe alloy quantum dots device sample (as well as the process shown in FIG. 7) by transmission electron microscopy (TEM)

Please refer to FIG. 8, which is a schematic side view illustrating an SiGe alloy quantum dots device (with the process shown in FIG. 7) by transmission electron microscopy (TEM). As shown clearly, there are spherical quantum dots in the SiGe alloy quantum dots device.

Figure 9:
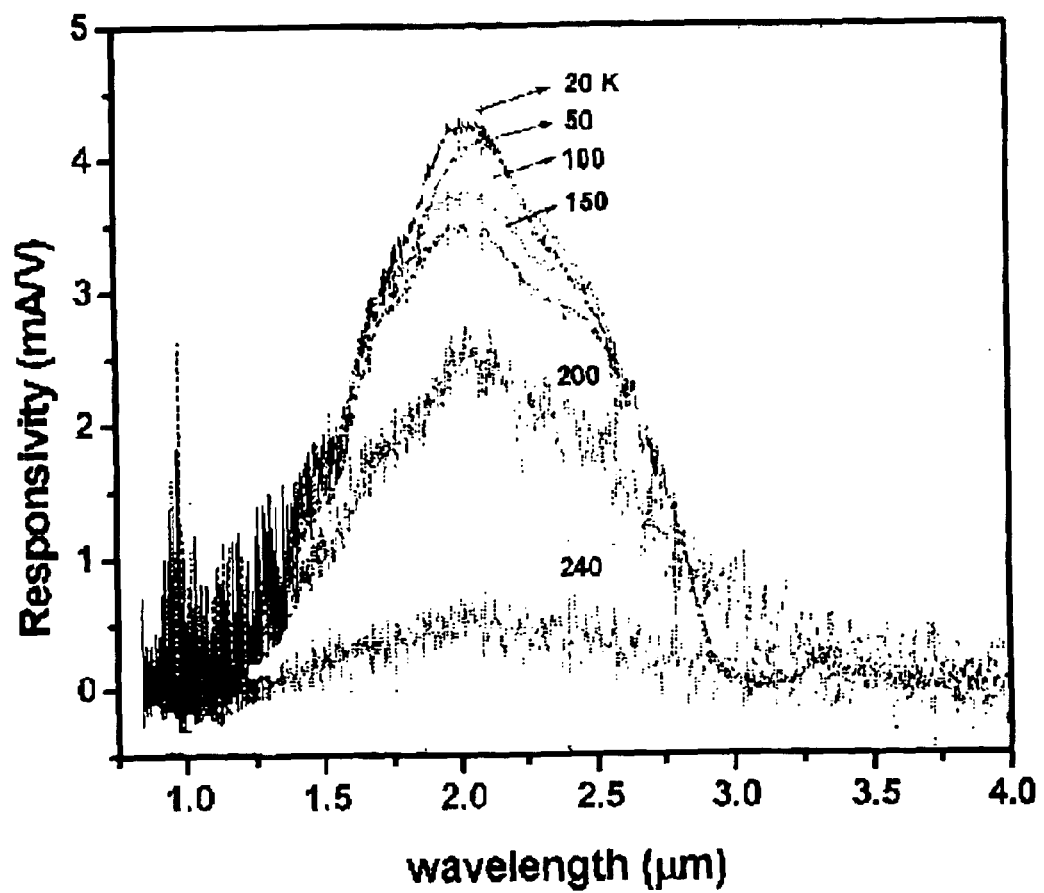
FIG. 9 is a graph illustrating the responsivity result of an SiGe alloy quantum dot infrared photodetector as a function of the wavelength at different temperatures.
Figure 10:
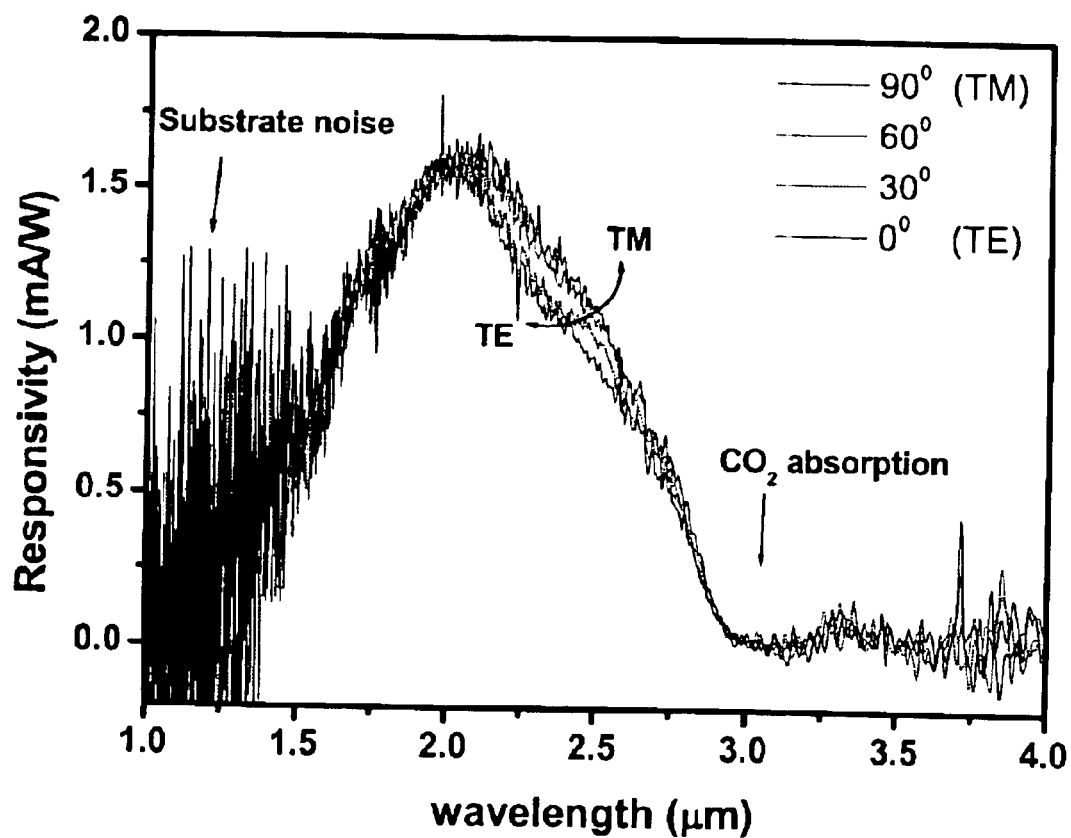
FIG. 10 is a graph illustrating the responsivity result of the SiGe alloy quantum dot infrared photodetector as a function of the wavelength. The angle between the polarization directions of the incident light and the axis parallel to the substrate surface is an independent variable.

Please refer to FIG. 9 and FIG. 10, wherein FIG. 9 depicts a graph illustrating the response of the SiGe alloy quantum dots infrared photodetector as a function of wavelength at different temperatures. The infrared detector, which was made by the method of the present invention, can operate up to a temperature of 240 degree K; and FIG. 10 is a graph illustrating the response of the SiGe alloy quantum dot infrared photodetector as a function of wavelength. The angle between the polarization direction of the incident light and the axis parallel to the substrate surface is an independent variable. As shown, the measured wavelength corresponds to the value of responsivity regardless of the polarization directions of the incidence light.

As stated above, the present invention provides a method of fabricating a device with spherical quantum dots by a combination of gas condensation and an epitaxial technique. The method is first to grow spherical quantum dots on the substrate by a gas condensation method, and then the substrate is loaded into an ultrasonic cleaner with methanol and is vibrated to form a monolayer or quantum dots, or loaded into an annealing furnace to thermally evaporate the excess spherical quantum dots at a high temperature to form a monolayer, and finally a spherical quantum dots device is grown up by an epitaxial technique so as to achieve a quantum dots device with better properties. By virtue of the above processes, the infrared detector which is made by the method of the present invention, for instance, has the following properties:

(1) Spherical quantum dots can be grown with various elements and proportions.

(2) Since there is no selectivity with the substrates by utilizing gas condensation, quantum dots can be grown on various substrates in combination with an epitaxial technique.

(3) The process of gas condensation is very simple and is able to control the elemental proportion of quantum dots. Thereof, the required responding wavelength band can be adjusted by employing the confinement effect of quantum dots. In addition, the method of the present invention has high compatibility with traditional processing systems.

The present invention has been described with preferred embodiments thereof and it is understood that many changes and modifications in the described embodiment can be carried out without departing from the scope and the spirit of the invention as defined by the appended claims.

What is claimed:

1. A method of fabricating a device with spherical quantum dots by a combination of gas condensation and an epitaxial technique, comprising:

(a) a quantum dots growth step, in which the quantum dots are grown on a substrate by a gas condensation method;

(b) a quantum dots processing step, in which an ultrasonic cleaner is used with an organic solvent to vibrate the substrate on which quantum dots have been grown in step (a), or in which the substrate on which quantum dots have been grown in step (a) is thermally annealed at a high temperature; and (c) an epitaxial layer cover step, in which an epitaxial technique is used for covering the quantum dots which have been processed by step (b) with an epitaxial layer.

2. The method of claim 1, further comprising a substrate processing step, wherein a reactive ion etching method is used to process the substrate and the surface of the substrate is roughened so as to increase the quantum dots growth density in step (a).

3. The method of claim 1, wherein the gas condensation method in step (a) is selected from the group consisting of a thermal evaporation method, a sputtering method, an electron beam evaporation method, and a laser ablation method.

4. The method of claim 1, wherein the quantum dots are grown in step (a) from a material selected from the group consisting of metal material, semiconductor material, and oxide insulator material.

5. The method of claim 1, wherein the quantum dots are grown in step (a) from any two materials selected from the group consisting of metal material, semiconductor material, and oxide insulator material.

6. The method of claim 1, wherein the organic solvent in step (b) is selected from the group consisting of alcohol and acetone.

7. The method of claim 1, wherein alumina powder is added to the organic solvent during step (b) to enhance the deposition density of the quantum dots.

8. The method of claim 1, wherein metal powder or metal oxide powder is added into the organic solvent during the vibration processing in step (b) to obtain a thin layer of quantum dot.

9. The method of claim 1, wherein the substrate is loaded into an annealing furnace to evaporate excess quantum dots at a high temperature to obtain a thin layer of quantum dots.

10. The method of claim 1, wherein the epitaxial technique in step (c) is selected from the group consisting of molecular beam epitaxy and metal vapor deposition.

11. A method of fabricating a multi-layer quantum dots device by a combination of gas condensation and an epitaxial technique, comprising:

(a) a quantum dots growth step, in which the quantum dots are grown on a substrate by a gas condensation method;

(b) a quantum dots processing step, in which an ultrasonic cleaner is used with an organic solvent to vibrate the substrate on which quantum dots have been grown in step (a), or in which an annealing furnace is used at a high temperature to evaporate excess quantum dots on the substrate on which quantum dots have been grown in step (a);

(c) an epitaxial layer cover step, which the epitaxial technique is used for covering an epitaxial layer on the quantum dots which have been processed in step (b); and (d) repeating the foregoing steps to obtain the multilayer quantum dots device.

12. The method of claim 11, further comprising a substrate processing step, wherein a reactive ion etching method is used to process the substrate and the surface of the substrate is roughened to increase the quantum dots growth density in step (a).

13. The method of claim 11, wherein the gas condensation method in step (a) can be selected from the group consisting of a thermal evaporation method, a sputtering method, an electron beam evaporation method, and a laser ablation method.

14. The method of claim 11, wherein the quantum dots are grown in step (a) from a material selected from the group consisting of metal material, semiconductor material, and oxide insulator material.

15. The method of claim 11, wherein the quantum dots are grown in step (a) from any two materials selected from the group consisting of metal material, semiconductor material, and oxide insulator material.

16. The method of claim 11, wherein the organic solvent in step (b) is selected from a group consisting of the alcohol and acetone.

17. The method of claim 11, wherein in said vibration process in step (b), alumina powder is added to the organic solvent so as to enhance the deposition density of the quantum dots.

18. The method of claim 11, wherein metal powder or metal oxide powder is added into the organic solvent during the vibration processing in step (b) to obtain a thin layer quantum dots.

19. The method of claim 11, wherein a thermal annealing of the substrate at a high temperature is used in step (b) to obtain a thin layer quantum dots sample.

20. The method of claim 11, wherein the epitaxial technique in step (c) is selected from the group consisting of molecular beam epitaxy and metal organic chemical vapor deposition.

* * * * *